(12) United States Patent
Fann et al.

(10) Patent No.: US 7,576,428 B2
(45) Date of Patent: Aug. 18, 2009

(54) MELTING TEMPERATURE ADJUSTABLE METAL THERMAL INTERFACE MATERIALS AND APPLICATION THEREOF

(75) Inventors: Yuan-Chang Fann, Hsinchu County (TW); Jen-Dong Hwang, Hsinchu (TW); Cheng-Chou Wong, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 83 days.

(21) Appl. No.: 11/735,443

(22) Filed: Apr. 14, 2007

(65) Prior Publication Data
US 2008/0110609 A1 May 15, 2008

(30) Foreign Application Priority Data
Nov. 15, 2006 (TW) ............................. 95142234 A
Feb. 15, 2007 (TW) ............................. 96105743 A

(51) Int. Cl.
*H01L 23/373* (2006.01)
(52) U.S. Cl. ............... 257/712; 257/717; 257/E23.11
(58) Field of Classification Search ............. 257/712, 257/717, E23.11
See application file for complete search history.

(56) References Cited

U.S. PATENT DOCUMENTS

| 4,384,610 | A | 5/1983 | Cook et al. |
| 5,904,796 | A | 5/1999 | Freuler et al. |
| 5,981,641 | A | 11/1999 | Takahashi et al. |
| 6,311,769 | B1 | 11/2001 | Bonneville et al. |
| 6,343,647 | B2 | 2/2002 | Kim et al. |
| 6,761,928 | B2 | 7/2004 | Hill et al. |
| 6,791,839 | B2 * | 9/2004 | Bhagwagar .................. 361/705 |
| 6,797,758 | B2 | 9/2004 | Misra et al. |
| 2007/0228109 | A1 * | 10/2007 | Smith et al. .................. 228/176 |

OTHER PUBLICATIONS

Article Titled "Thermodynamic optimization of the lead-free solder system Bi-In-Sn-Zn" jointly authored by Moelans et al., Journal of Alloys and Compounds 360 (2003) pp. 98-106.
Article Titled "Phase relationships in Bi-In-Sn alloy system" jointly authored by Kabassis et al., Materials Science and Technology Oct. 1986 Vo. 2 pp. 985-988.
Article Titled "Origin of microstructure in 350 K eutectic of Bi-In-Sn ternary system" jointly authored by Ruggiero et al., Materials Science and Technology Feb. 1995 vol. 11 pp. 136-142.
Article Titled "Investigation of the Phase Equilibria in the Sn-Bi-In Alloy System" jointly authored by Yoon et al., Metallurgical and Materials Transactions A vol. 30A. Jun. 1999 pp. 1503-1515.
Article Titled "Thermodynamics-Aided Alloy Design and Evaluation of Pb-Free Solder, Sn-Bi-In-Zn System" jointly authored by Yoon et al. Acta mater. vol. 45, No. 3, pp. 951-960, 1997.

* cited by examiner

*Primary Examiner*—Victor A Mandala
(74) *Attorney, Agent, or Firm*—Jianq Chyun IP Office

(57) ABSTRACT

A melting temperature adjustable metal thermal interface material (TIM) is provided. The metal TIM includes In, Bi, Sn, and Ga. A content of Ga ranges from 0.01 wt % to 3 wt %. The metal TIM has an initial melting temperature lower than 60° C. and has no element hazardous to the environment.

22 Claims, 9 Drawing Sheets

MELTING TEMPERATURE ADJUSTABLE METAL THERMAL INTERFACE MATERIALS AND APPLICATION THEREOF

CROSS-REFERENCE TO RELATED APPLICATION

This application claims the priority benefit of Taiwan application serial. no. 95142234, filed Nov. 15, 2006 and application serial. no. 96105743, filed Feb. 15, 2007. All disclosure of the Taiwan applications are incorporated herein by reference.

BACKGROUND OF THE INVENTION

1. Field of the Invention

The present invention relates to a melting temperature adjustable metal thermal interface material (TIM) applicable to an interface between a microelectronic packaging component and a heat dissipation device, so as to facilitate the heat dissipation of the microelectronic component.

2. Description of Related Art

Due to the trends of multifunction, high speed, high power and/or miniaturization, microelectronic components such as LEDs having high luminance, digital signal processors and central processing units (CPUs) generate a higher heat flow, presumably causing the components' junction temperatures to exceed save operation limits. In order to prevent overheating problems of chips, the newly developed microelectronic components have been designed toward multiple cores, dynamic voltage and/or frequency scaling, or miniaturization in integrated circuits. Thereby, the aforesaid overheating problems such as a local hot spot on the chip can be reduced. According to the design difference of various microelectronic components and their dynamic operating powers, the junction temperature or the heat flow of the chips (or the dies) may vary at any time. Said requirement for the heat dissipation of the different chips brings forward diversity and development of innovative technology with respect to the microelectronic dissipation materials and the heat dissipation devices. Among the aforesaid materials, a TIM applicable to an interface between the microelectronic component and the heat dissipation device conducts the heat through a surface contact with said interface, such that the heat can be transferred effectively to the heat dissipation device such as a substrate, a heat spreader, or a heat sink. Air gaps or voids frequently appear between the interface of the microelectronic component and the heat dissipation device, and thus hinder heat conduction. The TIM characterized by fluidity or a phase change i.e. being softened or melted to a liquid state when heated is capable of filling the air gaps or the voids, so as to reduce the thermal resistance between the microelectronic component and the heat dissipation device and to improve the heat dissipation.

The above-mentioned TIMs are mostly polymer compounds, such as thermal greases and phase change materials, and the TIMs are mainly composed of poor thermal conductive polymer matrices and inorganic fillers, as disclosed in U.S. Pat. Nos. 5,981,641, 5,904,796, and 6,311,769. To further improve the heat dissipation performance of the TIMs and to prevent the polymer compounds from being deteriorated on account of thermal cycling or an ultraviolet radiation, low melting point alloys (LMAs) that are highly thermal conductive as opposed to the polymer compounds have been preferably utilized in recent research of the TIMs. Said TIMs are in a solid state under room temperature and can be melted to the liquid state when heated.

However, different microelectronic components have different heat flows. With variable dynamic operating powers, the newly developed microelectronic components possess various heat flows and different junction temperatures at any time. Because of said operation characteristics, in practice, the phase change temperatures of the phase change materials are generally designed to fall in a range of 45° C.-60° C. to meet the requirement for the heat dissipation. Although the LMAs having initial melting temperatures between 43° C. and 58° C. and including elements such as Bi, In, Pb, Sn, Cd, and so on have been well developed and applied for a period of time, the LMAs are not in compliance with the "Restriction of the use of certain hazardous substance in EEE (ROHS)" regulated by the European Union, for the hazardous elements such as Pb, Cd and the like are included in said LMAs.

The idea of utilizing the LMAs as the TIM was first proposed by Cook and Token (with reference to "A Novel Concept For Reducing Thermal Resistance" in *Journal of Spacecraft*, Vol. 21, No. 1122-124, published in 1984) and by U.S. Pat. No. 4,384,610 (entitled "Simple Thermal Joint", issued in 1983). In subsequent patents of applying the LMAs to the TIMs in compliance with ROHS, as were disclosed in U.S. Pat. Nos. 6,797,758, 6,343,647, and 6,761,928, the alloy compositions thereof do not go beyond the research documentations on solder alloys. The documentations, for example, include the research of an Sn—In—Bi alloy (referring to H. Kabassis, J. W. Rutter, and W. C. Winegard: Metall. Trans., A 1984, Vol. 15A, pp1515-17. and Mater. Sci. Technol., 1986, Vol. 2, p. 985.) and the research of a Bi—In—Sn—Zn alloy (referring to *Journal of Alloys and Compounds* 360, 2003, pp 98-106, entitled "Thermodynamic optimization of the lead-free solder system Bi—In—Sn—Zn"). However, the lowest melting temperature of the above-referenced alloys (i.e. an eutectic temperature) is approximately 10° C. higher than the LMAs containing the hazardous elements such as Pb and Cd.

Eutectic In—Bi—Sn alloy TIM with components conforming to the RHOS and with the initial melting temperature at about 60° C. can merely develop heat dissipation performance on a condition that the junction temperature of the eutectic In—Bi—Sn alloy TIM exceeds 60° C., and thereby a liquid phase can then be generated to fill the air gaps or the voids in the interface. In other words, when the junction temperature is below the melting point of said alloy TIM, the air gaps and/or the voids are not filled, leading to a bottleneck in the heat conduction. In that situation, the eutectic In—Bi—Sn alloy TIM cannot be effectively applied to the newly developed microelectronic components having variable dynamic operating powers. Although metals of Ga and Ga—In—Sn liquid alloys have even much lower melting temperatures, they are not suitable for the metal TIM application, for they are in the liquid state under room temperature and thus are not easy to handle. Accordingly, it is desirable to develop and employ a non-hazardous metal TIM which has a lower melting temperature and achieves better heat dissipation performance within a wide junction temperature range, such that the bottleneck in the heat conduction can be avoided.

SUMMARY OF THE INVENTION

The present invention provides a metal TIM applicable to an interface between a microelectronic packaging component and a heat dissipation device. The melting temperature adjustable metal TIM is capable of preventing undesirable heat dissipation caused by the fact that the melting temperatures of conventional LMAs are not low enough.

The present invention further provides a metal TIM to achieve favorable heat dissipation performance within a wider temperature range The present invention further provides a use of a metal TIM fairly suitable for a microelectronic component characterized by variable dynamic operating powers or different junction temperatures at any time, such that the heat dissipation efficiency between the microelectronic packing component and a heat dissipation device can be enhanced.

To resolve the issues discussed above, the present invention provides a metal TIM including In, Bi, Sn, and Ga. A content of Ga ranges from 0.01 wt % to 3 wt %.

The present invention further provides a metal TIM including In, Bi, and Ga. A content of Ga ranges from 0.01 wt % to 3 wt %.

The present invention further provides a use of the metal TIM as described hereinbefore, including using the metal TIM in a form of a metal foil or in an irregularly-shaped form on an interface between a heat-generating microelectronic component and a heat dissipation device, so as to facilitate the heat dissipation of the microelectronic component.

The present invention further provides a packaging apparatus at least including a heat-generating microelectronic component, a heat dissipation device and said metal TIM. The metal TIM is disposed on a heat conduction path at a junction between a surface of the heat-generating microelectronic component and a surface of the heat dissipation device.

The present invention further provides an electric power equipment including said packaging apparatus.

The particular alloy composition of the present invention can be melted to the liquid state when heated, and an initial melting temperature of the alloys is below 60° C. (preferably ranging from 40° C. to 57° C.). With a lower initial melting temperature in contrast to conventional materials, the alloy composition of the present invention is applicable to the microelectronic component characterized by variable dynamic operating powers or different junction temperatures at any time for the heat dissipation. In addition, with said low initial melting temperature, the metal TIM of the present invention achieves better heat dissipation performance within a wider temperature range, and thus the metal TIM is rather suitable for being applied to the interface between the microelectronic component and the heat dissipation device.

In order to make the aforementioned and other objects, features and advantages of the present invention more comprehensible, several embodiments accompanied with figures are described in detail below.

DESCRIPTION OF EMBODIMENTS

Figure 1:
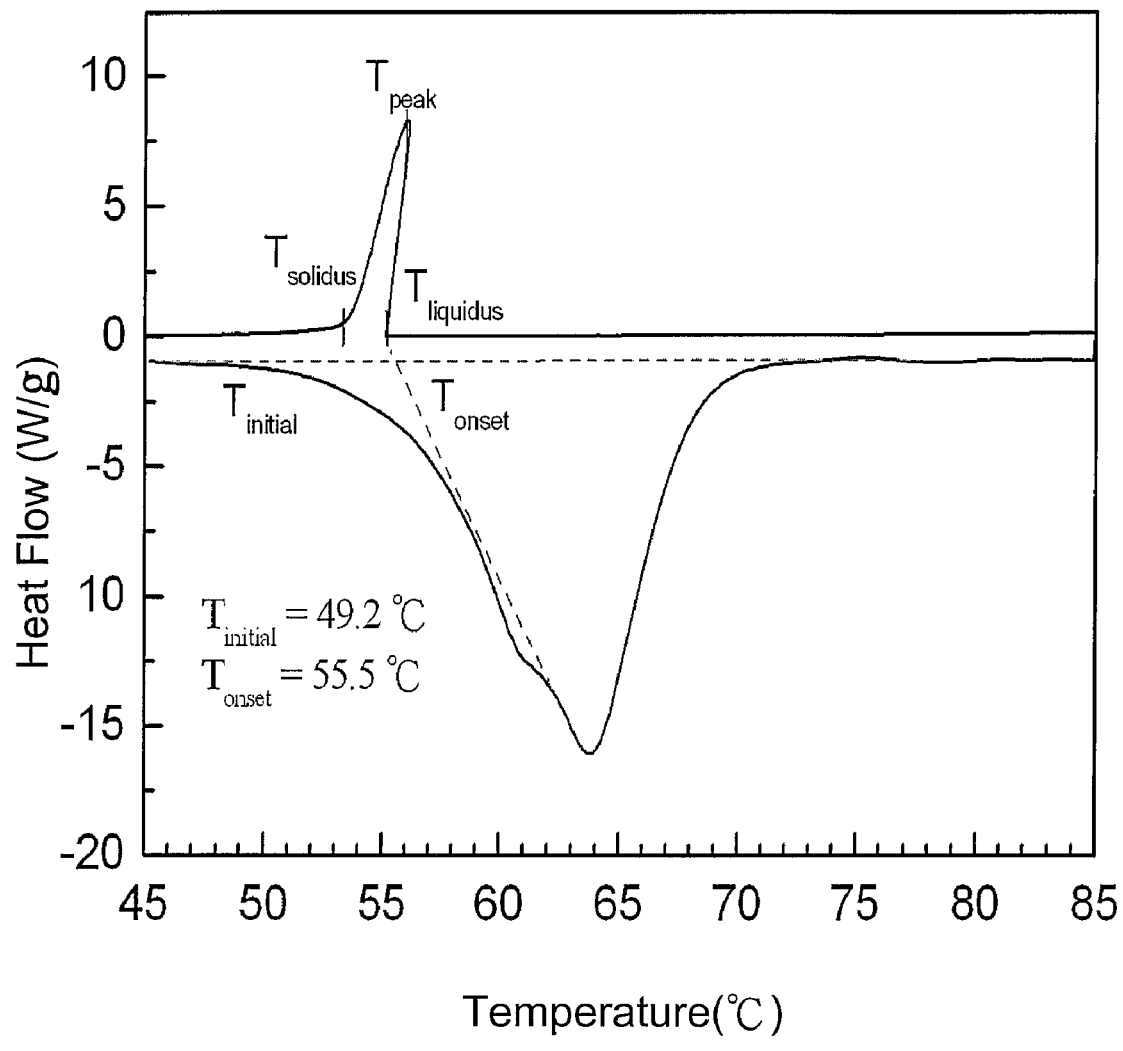
FIG. 1 is a curve showing heat flow variations in a melting reaction and a solidification reaction of an alloy constituted by 50.8 wt % of In, 32.4 wt % of Bi, 16.5 wt % of Sn and 0.3 wt % of Ga according to a first embodiment of the present invention.

Several embodiments of a metal TIM of the present invention are introduced hereinafter for proving an efficacy of the present invention instead of limiting the contents of the components in the present invention. Moreover, the metal TIM in the following embodiments is tested in a form of a metal foil. The metal TIM of the present invention substantially includes In, Bi, Sn, and Ga. Here, a content of Ga ranges from 0.01 wt % to 3 wt %. In addition, contents of In, Bi, and Sn are respectively in a range of 20 wt %-70 wt %, 30 wt %-60 wt %, and 0.01 wt %-30 wt %. In another aspect, the metal TIM of the present invention may include no Sn.

Besides the following embodiments, the metal TIM of the present invention may further include a combination of non-hazardous elements such as Ag, Cu, Zn, Ge, Al, Ce, La or Si and impurity elements.

Melting temperatures of the metal foils disclosed in the embodiments are measured with use of a DuPont Instruments Differential Scanning Calorimeter (DSC) 910. Each specimen of the metal foils is pressed into superimposed aluminum crucibles having genuine parts Nos. 032090 and 022692. Then, the sample of the metal foil is heated from the room temperature to 120° C. and then cooled down to the room temperature again at a heating/cooling rate of 10° C. per minute. The measurement of the melting temperature for the metal foils of different alloys includes measuring an initial melting temperature $T_{initial}$ and an extrapolated onset melting temperature $T_{onset}$. Here, $T_{initial}$ denotes the initial melting temperature represented by an endothermic curve of a melting reaction, while $T_{onset}$ refers to an intersection point of an extension line of a base line of the endothermic curve in the melting reaction and a tangent passing through an inflection point of the endothermic curve.

According to an ASTM D5470 standard, a thermal impedance test for each of the TIM specimens is conducted with use of a thermal impedance measuring apparatus manufactured by Long Win Science & Technology Co., Ltd. Under 3.1 kg/cm² of pressure and an ambient temperature at 35.3° C., various TIM specimens, as being operated with variable heating powers, are measured to obtain the temperatures of an upper interface and a lower surface of each of the TIM specimens.

To compare the heat dissipation performance of the metal TIM in the form of the metal foil as provided in the present invention, other reference metal TIMs not only include a conventional eutectic alloy foil having a weight composition ratio of In51-Bi32.5-Sn16.5, but also include a 7762 thermal grease which is mainly constituted by a mixture of silicon oil, zinc oxide powder and aluminum powder and is manufactured by Shin-Etsu Chemical company.

The First Embodiment

In the first embodiment of the present invention, three In—Bi—Sn—Ga alloys are melted and prepared with respective weight compositions as shown in Table 1. The three alloys are named 0.3 Ga-modified LMA, 0.1 Ga-modified LMA, and 0.05 Ga-modified LMA for short, respectively. Moreover, the three alloys are sampled in respective amounts of 55.6 mg, 35.0 mg and 35.6 mg for further analysis with use of the DuPont Instruments DSC 910.

TABLE 1

| Alloy Composition | In | Bi | Sn | Ga |
|---|---|---|---|---|
| | (unit: wt %) | | | |
| 0.3Ga-MLMA | 50.8 | 32.4 | 16.5 | 0.3 |
| 0.1Ga-MLMA | 50.9 | 32.5 | 16.5 | 0.1 |
| 0.05Ga-MLMA | 50.95 | 32.5 | 16.5 | 0.05 |

FIG. 1 shows heat flow variations in a melting reaction and a solidification reaction of said 0.3 Ga-modified LMA. The extrapolated onset melting temperature $T_{onset}$ and the initial melting temperature $T_{initial}$ are respectively 55.5° C. and 49.2° C. according to the measurement of the endothermic curve of the melting reaction. In contrast, the exothermic curve of the solidification reaction indicates a special phenomenon that a peak temperature is slightly higher than a liquidus temperature, which is arisen from a chemical reaction between a Ga-containing alloy liquid and an aluminum crucible. Other Ga-containing alloy liquids in the present embodiment bring about similar results.

Figure 2:
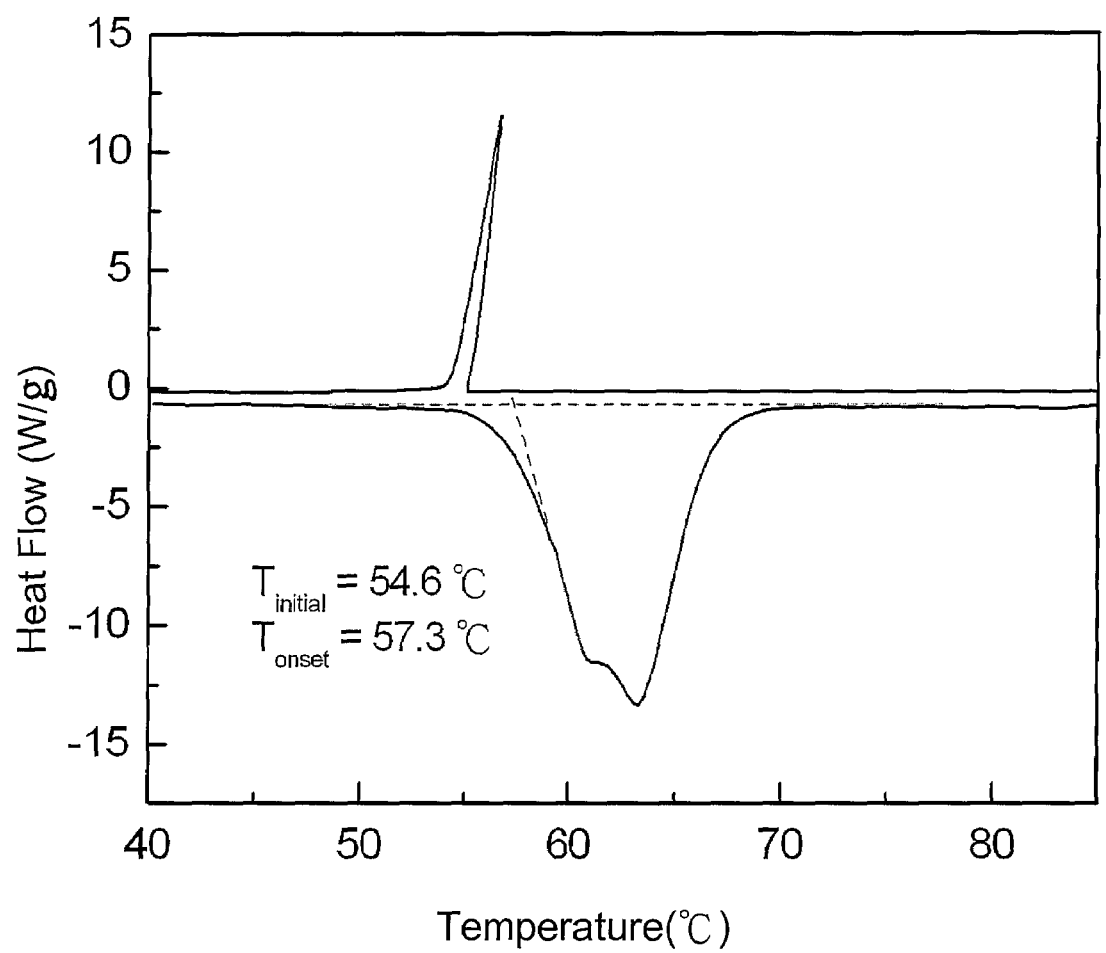
FIG. 2 is a curve showing heat flow variations in a melting reaction and a solidification reaction of an alloy constituted by 50.9 wt % of In, 32.5 wt % of Bi, 16.5 wt % of Sn and 0.1 wt % of Ga according to a first embodiment of the present invention.

FIG. 2 shows heat flow variations in a melting reaction and a solidification reaction of said 0.1Ga-modified LMA. The extrapolated onset melting temperature $T_{onset}$ and the initial melting temperature $T_{initial}$ are respectively 57.3° C. and 54.6° C. according to the measurement of an endothermic peak of the melting reaction.

Figure 3:
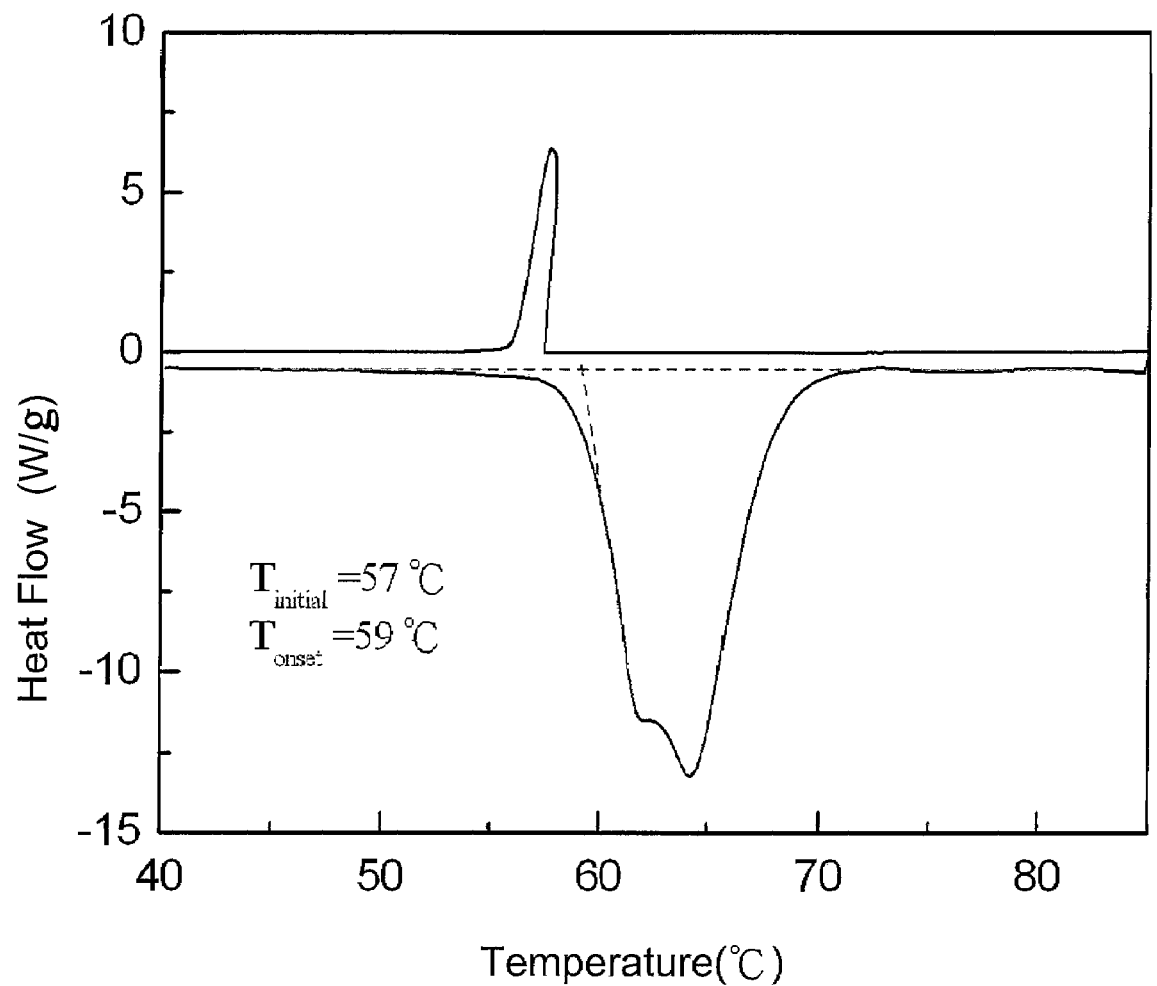
FIG. 3 is a curve showing heat flow variations in a melting reaction and a solidification reaction of an alloy constituted by 50.95 wt % of In, 32.5 wt % of Bi, 16.5 wt % of Sn and 0.05 wt % of Ga according to a first embodiment of the present invention.

FIG. 3 shows heat flow variations in a melting reaction and a solidification reaction of said 0.05 Ga-modified LMA. The extrapolated onset melting temperature $T_{onset}$ and the initial melting temperature $T_{initial}$ are respectively 59.0° C. and 57.0° C. according to the measurement of the endothermic peak of the melting reaction.

Figure 4:
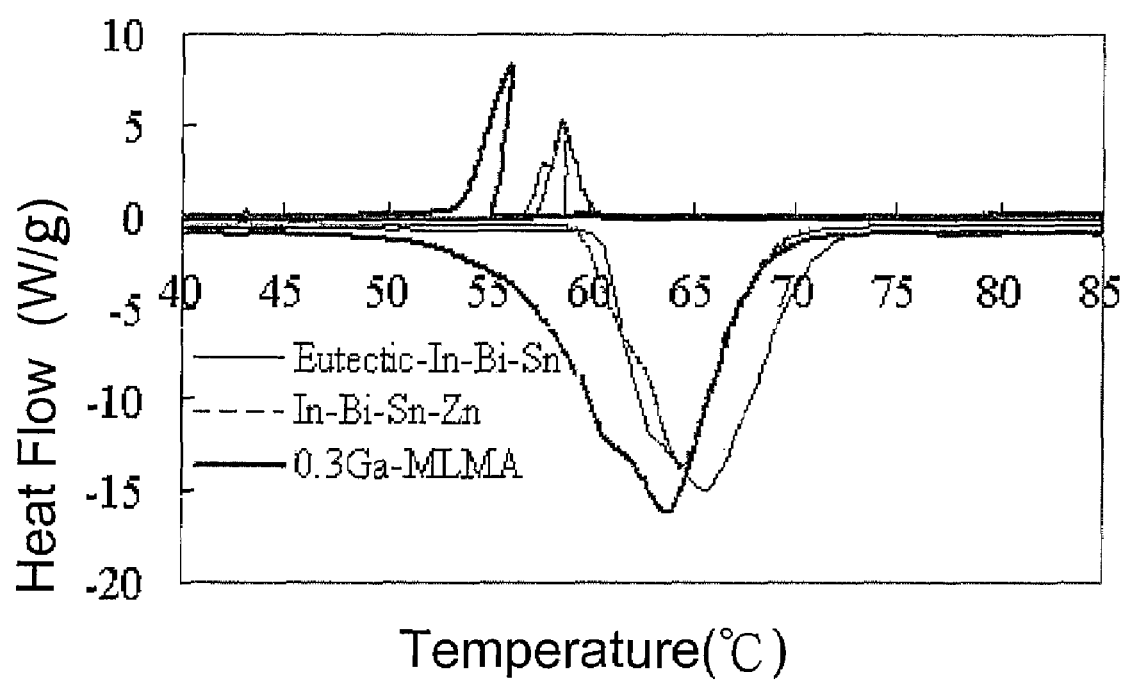
FIG. 4 is a curve showing heat flow variations in a melting reaction and a solidification reaction of an alloy and reference alloys according to a first embodiment of the present invention.

FIG. 4 is a curve showing a heat flow variation in a melting reaction and a solidification reaction when a 0.3 Ga-modified LMA, a conventional eutectic alloy with the weight composition ratio of In51-Bi32.5-Sn16.5 (referred to as "eutectic In—Bi—Sn alloy" hereinafter), and an alloy comprising 48.2 wt % of In, 35.4 wt % of Bi, 15.9 wt % of Sn, and 0.5 wt % of Zn (referred to as "In—Bi—Sn—Zn alloy" hereinafter) are added. The difference among the endothermic curves of the melting reactions as depicted in FIG. 4 clearly indicates an effect on reducing the initial melting temperature of the 0.3 Ga-modified LMA.

The values of the extrapolated onset melting temperatures and the initial melting temperatures of said five alloys are enumerated in the following Table 2.

TABLE 2

| Alloy Composition | In | Bi | Sn | Zn | Ga | $T_{onset}$ | $T_{initial}$ |
|---|---|---|---|---|---|---|---|
| | (unit: wt %) | | | | | (unit: ° C.) | |
| In—Bi—Sn—Zn | 48.2 | 35.4 | 15.9 | 0.5 | | 59.5 | 58.7 |
| Eutectic In—Bi—Sn | 51 | 32.5 | 16.5 | | | 60.7 | 59.7 |
| 0.3Ga-MLMA | 50.8 | 32.4 | 16.5 | — | 0.3 | 55.5 | 49.2 |
| 0.1Ga-MLMA | 50.9 | 32.5 | 16.5 | — | 0.1 | 57.3 | 54.6 |
| 0.05Ga-MLMA | 50.95 | 32.5 | 16.5 | — | 0.05 | 59.0 | 57.0 |

The Second Embodiment

In the second embodiment, In—Bi—Sn—Ga alloys respectively having 1 wt % of Ga and 0.5 wt % of Ga are prepared, referred to as 1 Ga-MLMA and 0.5 Ga-MLMA for short, respectively, and the alloy compositions thereof are shown in Table 3. Identical to the first embodiment, the two alloys in the present embodiment as illustrated in Table 3 are sampled for further analysis with use of the DuPont Instruments DSC 910.

TABLE 3

| Alloy Composition | In | Bi | Sn | Ga |
|---|---|---|---|---|
| | (unit: wt %) | | | |
| 1Ga-MLMA | 50.5 | 32.0 | 16.5 | 1.0 |
| 0.5Ga-MLMA | 50.8 | 32.3 | 16.5 | 0.5 |

Figure 5:
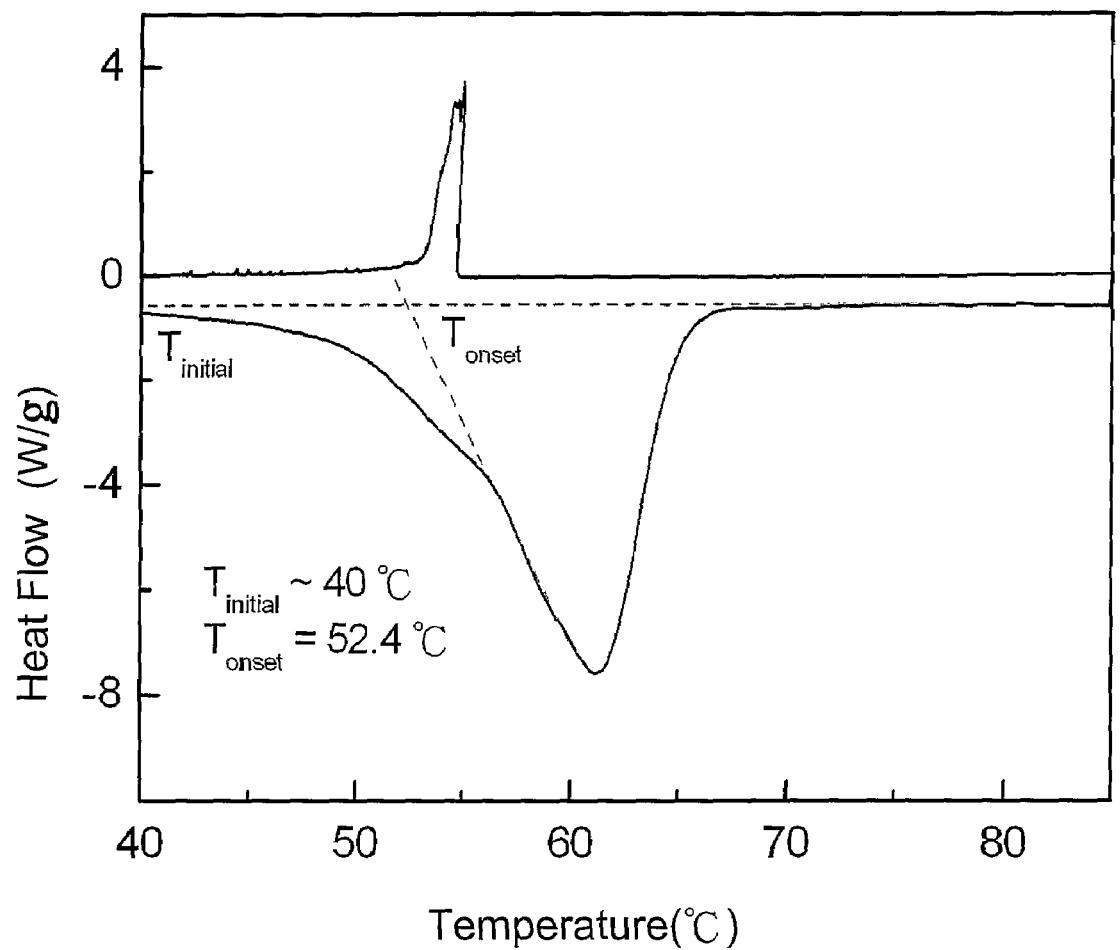
FIG. 5 is a curve showing heat flow variations in a melting reaction and a solidification reaction of an alloy constituted by 50.5 wt % of In, 32.0 wt % of Bi, 16.5 wt % of Sn and 1 wt % of Ga according to a second embodiment of the present invention.
Figure 6:
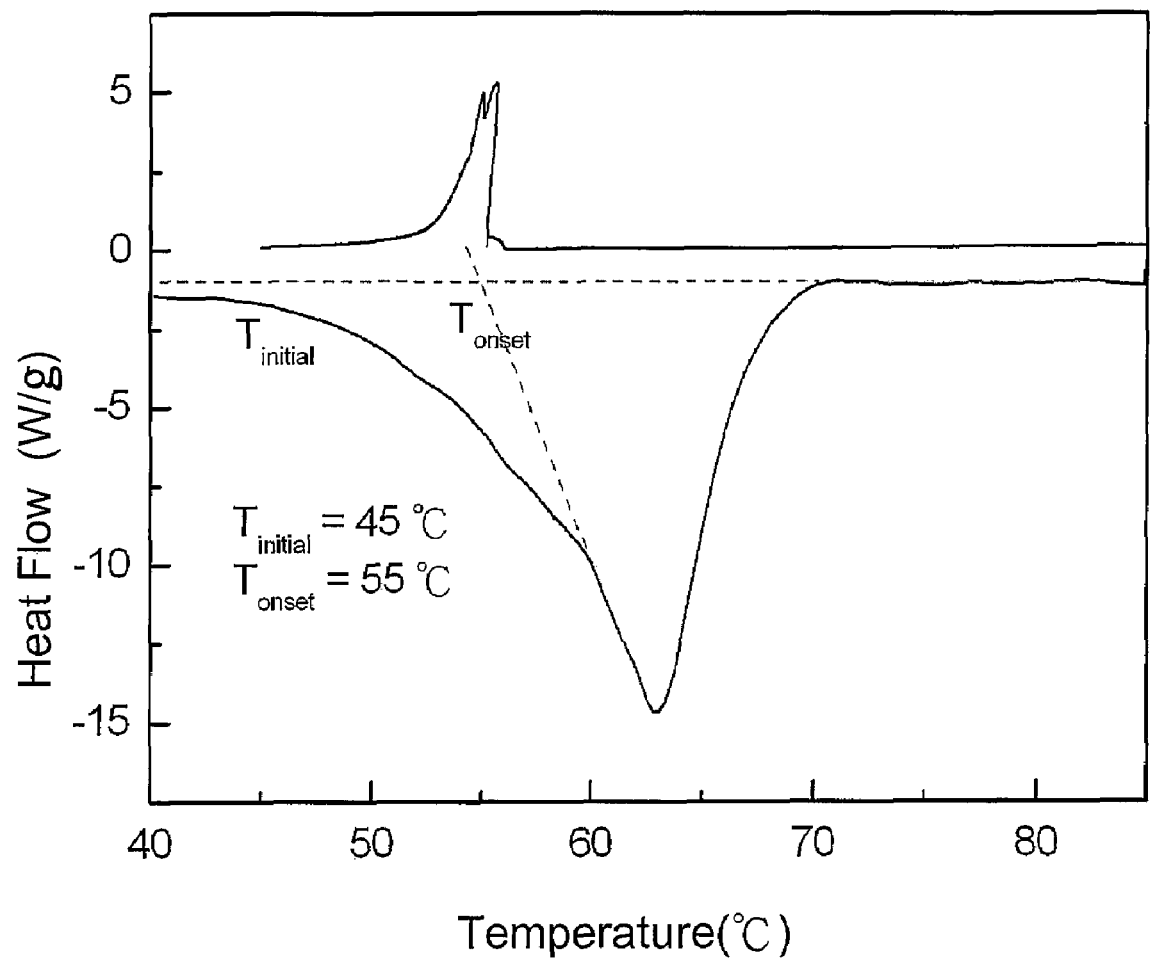
FIG. 6 is a curve showing heat flow variations in a melting reaction and a solidification reaction of an alloy constituted by 50.8 wt % of In, 32.3 wt % of Bi, 16.5 wt % of Sn and 0.5 wt % of Ga according to a second embodiment of the present invention.

Heat flow variations in melting reactions and solidification reactions of said two eutectic In—Bi—Sn—Ga alloys are respectively depicted in FIGS. 5 and 6. The extrapolated onset melting temperatures $T_{onsets}$ of the two alloys are respectively 52.4° C. and 55° C. according to the measurement of the heat flow variations in each individual alloy, while the initial melting temperatures $T_{initials}$ thereof are approximately 40° C. and 45° C., respectively.

Figure 7:
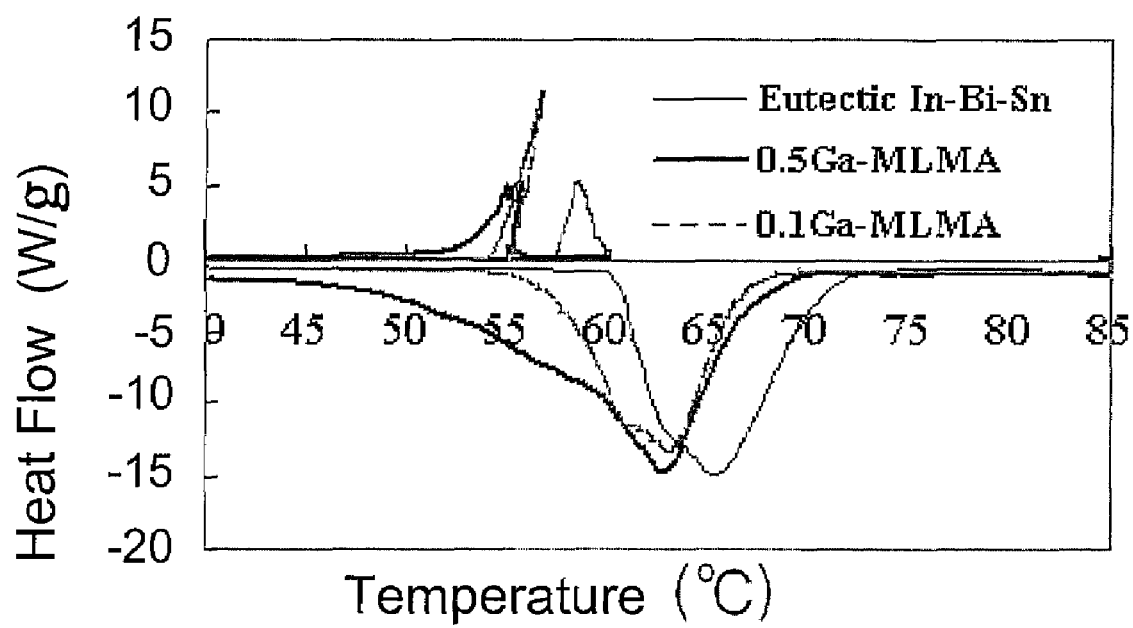
FIG. 7 is a curve showing heat flow variations in a melting reaction and a solidification reaction of an In—Bi—Sn—Ga alloy and reference alloys according to a second embodiment of the present invention.

In the present embodiment, the heat flow variations in the melting reactions and the solidification reactions of a 0.5 Ga-modified LMA, the 0.1 Ga-modified LMA of the first embodiment, and a reference eutectic In—Bi—Sn alloy are depicted in FIG. 7. According to FIG. 7, the more the added amount of Ga is, the lower the initial melting temperature is.

Table 4 lists the alloy composition, the extrapolated onset melting temperature and the initial melting temperature of each of the In—Bi—Sn—Ga alloys according to the second embodiment. In said Table 4, the extrapolated onset melting temperature of the 1 Ga-modified LMA is decreased to 52.4° C., and the initial melting temperature is reduced to 40° C. approximately. Likewise, the more the added amount of Ga is, the lower the initial melting temperature is.

In view of the foregoing, the initial melting temperatures of the In—Bi—Sn—Ga metal TIMs disclosed in the present invention are all below 60° C., preferably in the range of 40° C.-57° C.

TABLE 4

| Alloy Composition | In | Bi | Sn | Ga | $T_{onset}$ | $T_{initial}$ |
|---|---|---|---|---|---|---|
| | (unit: wt %) | | | | (unit: ° C.) | |
| Eutectic In—Bi—Sn | 51 | 32.5 | 16.5 | — | 60.7 | 59.7 |
| 1Ga-MLMA | 50.5 | 32.0 | 16.5 | 1.0 | 52.4 | ~40 |
| 0.5Ga-MLMA | 50.8 | 32.3 | 16.5 | 0.5 | 55.0 | 45 |

The Third Embodiment

Figure 8:
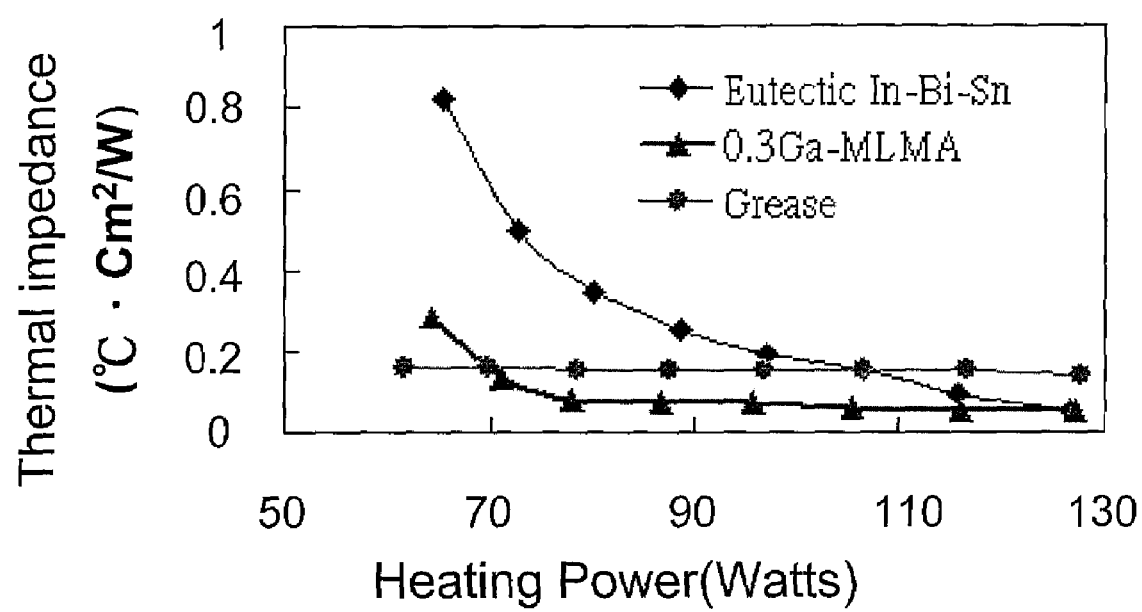
FIG. 8 is a curve showing a thermal impedance value of an In—Bi—Sn—Ga alloy foil and reference TIMs under different heating powers according to a third embodiment of the present invention.
Figure 9:
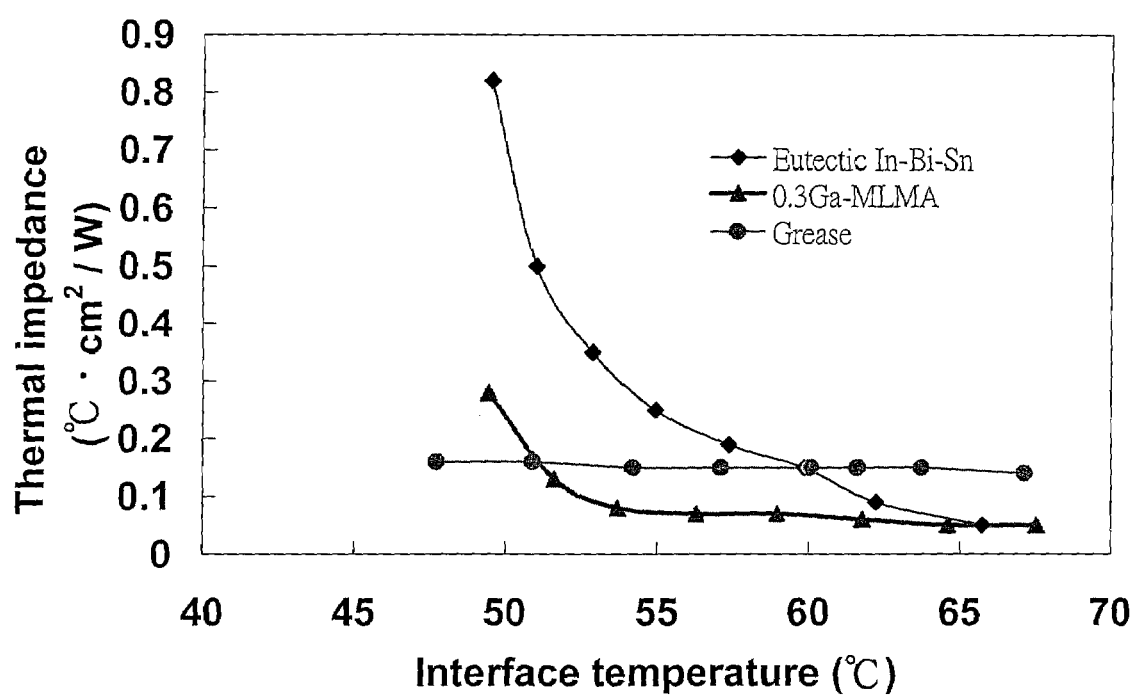
FIG. 9 is a curve showing a thermal impedance value of an In—Bi—Sn—Ga alloy foil and reference TIMs under different junction temperatures according to a third embodiment of the present invention.

To compare the differences of LMA foils having different initial melting temperatures when the alloy foils are actually applied to TIMs for heat dissipation performance, two alloy foils respectively constituted by a 0.3 Ga-modified LMA and by an eutectic In—Bi—Sn alloy are fabricated. In addition, the 7762 thermal grease (referred to as "grease") manufactured by the Shin-Etsu Chemical company is employed as a comparison basis of the heat dissipation performance. Said alloys with the different compositions are processed to form the metal foils in a thickness of 0.05 mm. Thermal impedance tests for the metal foils and the grease are respectively conducted for measuring and calculating junction temperatures and thermal impedance values under different heating powers. The data related to the above tests are shown in Table 5. FIG. 8 is a curve showing a relationship of the thermal impedance values of said different TIMs under the different heating powers, and FIG. 9 is a curve showing a relationship of the thermal impedance values of said different TIMs under the different junction temperatures. Here, the junction temperature on the horizontal axis is an average value of the junction temperatures $T_A$ and $T_D$ listed in Table 5.

After respectively obtaining the junction temperatures, both the thermal impedance values of the two LMA foils are around one third of the thermal impedance value of the grease, while there are still plenty of differences between the TIMs of the two LMAs. Due to the characteristic of the lower initial melting temperature, the 0.3 Ga-modified LMA foil has much lower thermal impedance values than the eutectic In—Bi—Sn alloy foil both on the conditions of the lower heating power and the lower junction temperature. As the junction temperature approaches to the initial melting temperature of the 0.3 Ga-modified LMA foil, the thermal impedance value thereof is slightly higher than the grease having a subtle variation in the thermal impedance value. However, the thermal impedance value of the eutectic In—Bi—Sn alloy foil at the similar junction temperature is approximately five times more than the grease. In addition, the 0.3 Ga-modified LMA foil of the present invention develops a superior heat dissipation performance when the junction temperature is at about 53° C. Contrarily, the eutectic In—Bi—Sn alloy foil can merely achieve the same heat dissipation performance when the junction temperature is at around 63° C. Accordingly, proven by the experimental results, the In—Bi—Sn—Ga alloy TIM of the present invention delivers an outstanding heat dissipation performance within a certain junction temperature range in which the microelectronic component may vary.

In view of the above results of the embodiments, compared with the conventional In—Bi—Sn alloy foil TIM, the metal TIM having the lower initial melting temperature as provided in the present invention develops better heat dissipation performance and has a much lower junction temperature. Therefore, when the melting temperature adjustable metal TIM of the present invention is applicable to the interface between the microelectronic packaging component and the heat dissipation device in the form of the metal foil, the heat flow can be transferred within a much wider range of the junction temperature. Thereby, the operation reliability of the microelectronic components such as CPUs, digital signal processors or LEDs having high luminance can be improved, and the present invention can be further adapted to the heat generating chips at different operating temperatures.

For example, the present invention can be applied to a packaging apparatus at least including one heat-generating microelectronic component, one heat dissipation device and said metal TIM. The metal TIM is disposed on a heat conduction path at a junction between a surface of the heat-generating microelectronic component and a surface of the heat dissipation device. The heat-generating microelectronic component is, for example, a semiconductor device, and the heat dissipation device may be a heat exchanger.

Moreover, the present invention can be further applied to an electric power equipment including said packaging apparatus. The electric power equipment is, for example, a computer, a game console, a television, a light emitting diode lamp, a power module, a high power inverter, a high power transistor, or a laser diode.

To sum up, the present invention is characterized in that the metal TIM can be melted to the liquid state when heated, and the initial melting temperature thereof is below 60° C. (preferably ranging from 40° C. to 57° C.). In comparison with the conventional metal TIM, the metal TIM of the present invention possesses the relatively low initial melting temperature. Likewise, the metal TIM of the present invention is rather applicable to the interface between the microelectronic packaging component and the heat dissipation device. Furthermore, the metal TIM of the present invention does not include the elements such as Pb, Cd and the like prohibited by the ROHS of the EU, and thus the In—Bi—Sn—Ga alloy foil non-hazardous to the environment can be provided by the present invention. In addition, through different compositions, the present invention is capable of obtaining lower initial melting temperatures, which is conducive to the application to the microelectronic component featuring variable dynamic operating powers or different junction temperatures at any time for the heat dissipation.

TABLE 5

| | Eutectic In—Bi—Sn | | | Shin-Etsu 7762 Grease | | | 0.3Ga-MLMA | |
| --- | --- | --- | --- | --- | --- | --- | --- | --- |
| Heating Power W | Junction temperature $T_A \cdot T_D$ ° C. | Thermal Impedance ° C. · cm²/W | Heating Power W | Junction temperature $T_A \cdot T_D$ ° C. | Thermal Impedance ° C. · cm²/W | Heating Power W | Junction temperature $T_A \cdot T_D$ ° C. | Thermal Impedance ° C. · cm²/W |
| 65.3 | 52.3 ` 46.7 | 0.82 | 61.6 | 48.3 ` 47.2 | 0.16 | 64.20 | 50.4 ` 48.5 | 0.28 |
| 72.6 | 52.9 ` 49.1 | 0.50 | 69.7 | 51.5 ` 50.3 | 0.16 | 71.0 | 52.1 ` 51.1 | 0.13 |
| 80.1 | 54.3 ` 51.4 | 0.35 | 78.4 | 54.8 ` 53.6 | 0.15 | 78.0 | 54.0 ` 53.4 | 0.08 |
| 88.4 | 56.1 ` 53.8 | 0.25 | 87.4 | 57.8 ` 56.4 | 0.15 | 86.6 | 56.6 ` 56.0 | 0.07 |
| 97.1 | 58.3 ` 56.4 | 0.19 | 96.9 | 60.8 ` 59.3 | 0.15 | 95.8 | 59.3 ` 58.6 | 0.07 |
| 106.6 | 60.7 ` 59.0 | 0.15 | 106.7 | 62.4 ` 60.8 | 0.15 | 105.6 | 62.1 ` 61.4 | 0.06 |
| 115.9 | 62.8 ` 61.6 | 0.09 | 116.5 | 64.6 ` 62.8 | 0.15 | 116.1 | 64.9 ` 64.3 | 0.05 |
| 126.5 | 66.1 ` 65.4 | 0.05 | 127.6 | 68.1 ` 66.2 | 0.14 | 127.0 | 67.9 ` 67.2 | 0.05 |

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A metal thermal interface material (TIM), disposed at a junction between two solid materials for an improvement of heat conductivity, the metal TIM comprising 20 wt %-70 wt % of In, 30 wt %-60 wt % of Bi, 0.01 wt %-30 wt % of Sn, and Ga, wherein a content of Ga ranges from 0.01 wt % to 3 wt %, and an initial melting temperature of the metal TIM is controlled by the content of Ga.

2. The metal TIM as claimed in claim 1, further comprising at least an element non-hazardous to the environment.

3. The metal TIM as claimed in claim 2, wherein said element non-hazardous to the environment comprises Ag, Cu, Zn, Ge, Al, Ce, La and Si.

4. The metal TIM as claimed in claim 1, wherein an initial melting temperature of the metal TIM is below 60° C.

5. The metal TIM as claimed in claim 4, wherein the initial melting temperature of the metal TIM ranges from 40° C. to 57° C.

6. Use of the metal TIM as claimed in claim 1, comprising using the metal TIM in a form of a metal foil or in an irregularly-shaped form on an interface between a heat-generating microelectronic component and a heat dissipation device, so as to facilitate the heat dissipation of the microelectronic component.

7. A packaging apparatus, at least comprising a heat-generating microelectronic component, a heat dissipation device, and the metal TIM as claimed in claim 1, wherein the metal TIM is disposed on a heat conduction path at a junction between a surface of the heat-generating microelectronic component and a surface of the heat dissipation device.

8. The packaging apparatus as claimed in claim 7, wherein the heat-generating microelectronic component is a semiconductor device.

9. The packaging apparatus as claimed in claim 7, wherein the heat dissipation device is a heat exchanger.

10. An electric power equipment, comprising the packaging apparatus as claimed in claim 7.

11. The electric power equipment as claimed in claim 10, comprising a computer, a game console, a television, a light emitting diode lamp, a power module, a high power inverter, a high power transistor, or a laser diode.

12. A metal TIM, comprising 20 wt %-70 wt % of In, 30 wt %-60 wt % of Bi, and Ga, wherein a content of Ga ranges from 0.01 wt % to 3 wt %, and an initial melting temperature of the metal TIM is controlled by the content of Ga.

13. The metal TIM as claimed in claim 12, further comprising at least an element non-hazardous to the environment.

14. The metal TIM as claimed in claim 13, wherein said element non-hazardous to the environment comprises Ag, Cu, Zn, Ge, Al, Ce, La and Si.

15. The metal TIM as claimed in claim 12, wherein an initial melting temperature of the metal TIM is below 60° C.

16. The metal TIM as claimed in claim 12, wherein the initial melting temperature of the metal TIM ranges from 40° C. to 57° C.

17. Use of the metal TIM as claimed in claim 12, comprising using the metal TIM in a form of a metal foil or in an irregularly-shaped form on an interface between a heat-generating microelectronic component and a heat dissipation device, so as to facilitate the heat dissipation of the microelectronic component.

18. A packaging apparatus, at least comprising a heat-generating microelectronic component, a heat dissipation device, and the metal TIM as claimed in claim 12, wherein the metal TIM is disposed on a heat conduction path at a junction between a surface of the heat-generating microelectronic component and a surface of the heat dissipation device.

19. The packaging apparatus as claimed in claim 18, wherein the heat-generating microelectronic component is a semiconductor device.

20. The packaging apparatus as claimed in claim 18, wherein the heat dissipation device is a heat exchanger.

21. An electric power equipment, comprising the packaging apparatus as claimed in claim 20.

22. The electric power equipment as claimed in claim 21, comprising a computer, a game console, a television, a light emitting diode lamp, a power module, a high power inverter, a high power transistor, or a laser diode.

* * * * *